(12) United States Patent
Lin et al.

(10) Patent No.: US 11,952,662 B2
(45) Date of Patent: *Apr. 9, 2024

(54) POWDER ATOMIC LAYER DEPOSITION EQUIPMENT WITH QUICK RELEASE FUNCTION

(71) Applicant: SKY TECH INC., Hsinchu County (TW)

(72) Inventors: Jing-Cheng Lin, Hsinchu County (TW); Jung-Hua Chang, Hsinchu County (TW); Chia-Cheng Ku, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 125 days.

This patent is subject to a terminal disclaimer.

(21) Appl. No.: 17/504,270

(22) Filed: Oct. 18, 2021

(65) Prior Publication Data

US 2023/0120393 A1 Apr. 20, 2023

(51) Int. Cl.
*C23C 16/455* (2006.01)
*C23C 16/44* (2006.01)
*H01L 33/00* (2010.01)

(52) U.S. Cl.
CPC .... *C23C 16/45544* (2013.01); *C23C 16/4409* (2013.01); *C23C 16/4417* (2013.01); *H01L 33/005* (2013.01); *H01L 2933/0041* (2013.01)

(58) Field of Classification Search
None
See application file for complete search history.

(56) References Cited

U.S. PATENT DOCUMENTS

| | | | | |
|---|---|---|---|---|
| 5,003,919 | A * | 4/1991 | Yamamoto | G11B 5/70605 118/716 |
| 6,149,982 | A * | 11/2000 | Plester | B05D 1/62 427/322 |
| 11,739,423 | B2 * | 8/2023 | Lin | C23C 16/4417 118/716 |
| 11,767,591 | B2 * | 9/2023 | Lin | C23C 16/4417 118/716 |
| 2012/0085284 | A1 * | 4/2012 | Dassel | C23C 16/442 118/716 |
| 2013/0059073 | A1 * | 3/2013 | Jiang | C04B 35/62222 118/715 |

(Continued)

*Primary Examiner* — Karla A Moore
(74) *Attorney, Agent, or Firm* — Chun-Ming Shih; HDLS IPR SERVICES (57) ABSTRACT

Disclosed is a powder atomic layer deposition equipment with a quick release function, comprising a vacuum chamber, a shaft sealing device, and a driving unit connected to the shaft sealing device. The vacuum chamber is connected to the shaft sealing device, and an enclosed space is formed between the vacuum chamber and the shaft sealing device. At least one air extraction line is located in the shaft sealing device and fluidly connected to the enclosed space, the air extraction line being used in pumping gas out from the enclosed space to fix the vacuum chamber to the shaft sealing device so that the drive unit rotates the vacuum chamber via the shaft sealing device to facilitate the formation of a uniform thin film on powder surface. When the pumping stops, the vacuum chamber can be quickly released from the shaft sealing device to improve the process efficiency and convenience of use.

13 Claims, 7 Drawing Sheets

(56) References Cited

U.S. PATENT DOCUMENTS

| | | | |
|---|---|---|---|
| 2015/0125599 A1* | 5/2015 | Lindfors | C23C 16/45555 118/716 |
| 2017/0327948 A1* | 11/2017 | Dadheech | C23C 16/4417 |
| 2022/0106682 A1* | 4/2022 | Lin | C23C 16/4557 |
| 2022/0106684 A1* | 4/2022 | Lin | C23C 16/45574 |
| 2022/0136103 A1* | 5/2022 | Lin | C23C 16/45544 118/719 |
| 2022/0162750 A1* | 5/2022 | Lin | C23C 16/4417 |
| 2023/0037732 A1* | 2/2023 | Wang | C23C 16/45561 |

\* cited by examiner

POWDER ATOMIC LAYER DEPOSITION EQUIPMENT WITH QUICK RELEASE FUNCTION

TECHNICAL FIELD

The present disclosure relates to a powder atomic layer deposition equipment with a quick release function which allows fixing a vacuum chamber to a shaft sealing device, and a quick release of the vacuum chamber from the shaft sealing device.

BACKGROUND

A nanoparticle is defined as a particle smaller than 100 nanometer (nm) in at least one dimension, which shows entirely different physical and chemical properties comparing with that in macroscopic scale. Generally, macroscopic matters have all the same physical property, no matter what size they are, however neither do the nanoparticles. Nanoparticles have potential applications in the fields of biomedicine, optics and electronics, etc.

Quantum dots are nanoparticles of a semiconductor material. Currently studied semiconductor materials are II-VI materials, such as zinc sulfide (ZnS), cadmium sulfide (CdS) and cadmium selenide (CdSe), among which Cdse receives the most attention. The size of quantum dots is generally between 2-50 nm, and when quantum dots are exposed to UV light, electrons in the quantum dots absorb energy and jump from valence band into conduction band. When the excited electrons fall from conduction band to valence band, energy is released by emitting light.

The energy gap of quantum dots is related to the size. Larger quantum dots have smaller energy gap and emit light with longer wavelength. Smaller quantum dots have larger energy gap and emit light with shorter wavelength. For example, quantum dots having a size of 5-6 nm emit orange or red light, quantum dots having a size of 2-3 nm emits blue or green light. Of course, the light color also depends on the material of quantum dots.

A light-emitting diode (LED) employing quantum dots generates light with both a nearly continuous spectrum and a high color-rendering index, which is advantageous in improving the quality of light for the LED. In addition, the wavelength of the emitted light can be adjusted by changing the size of the quantum dots. Therefore, Quantum dots become the focus of the development of new-generation light-emitting devices and displays.

Although quantum dots possess the advantages and characteristics as described above, agglomeration is prone to occur in the process of manufacture or application. Moreover, quantum dots have a higher surface activity, and react with air and water vapor easily, thereby shortening their service life.

In particular, when making quantum dots into an LED sealant, agglomeration effect may occur, reducing the optical performance of quantum dots. Further, after the quantum dots are made into an LED sealant, oxygen or water vapor may still penetrate through the sealant and contact the surface of quantum dots, causing oxidation of the quantum dots, thereby affecting the efficiency or service life of quantum dots and LEDs. On the other hand, defects and dangling bonds on the surface of the quantum dots may cause non-radiative recombination, which also affects the emitting efficiency of quantum dots.

At present, the industry mainly employs powder atomic layer deposition (ALD) to form a nanometer-thick film on the surface of quantum dots, or form a multilayer film on the surface of quantum dots as a quantum well structure.

Atomic layer deposition can form a thin film with uniform thickness on the substrate, and the thickness of the thin film can be effectively controlled. Theoretically, it is also suitable for three-dimensional quantum dots. When the quantum dots are placed on the carrier plate, contact points exist between adjacent quantum dots, so that the precursor gas in an atomic layer deposition process cannot reach these contact points, causing failure in forming a uniform film on the surface of all nanoparticles.

SUMMARY

In general, atomic layer deposition is required to be performed in a vacuum environment. Therefore, equipments for atomic layer deposition often have a thicker structure with considerable weight, making it difficult in transportation or operation by a user. In view of the above, the present invention provides a powder atomic layer deposition equipment with a quick release function, wherein a vacuum chamber can be quickly released from a shaft sealing device and/or a driving unit after an atomic layer deposition process, allowing a user to easily take out powders from the vacuum chamber and clean the vacuum chamber.

An object of the present disclosure is to provide a powder atomic layer deposition equipment with a quick release function, which mainly comprises a driving unit, a shaft sealing device, and vacuum chamber, wherein the driving unit may be connected to the shaft sealing device or be released from the shaft sealing device, allowing a user to easily take out powders from the vacuum chamber and clean the vacuum chamber and thus improving convenience of use.

An object of the present disclosure is to provide a powder atomic layer deposition equipment with a quick release function, which mainly utilizes an air extraction line to control a connection state between a shaft sealing device and a vacuum chamber, getting rid of the complexity of fixing the vacuum chamber and the shaft sealing device by screws. The convenience of release or installation of the vacuum chamber onto the shaft sealing device can also be greatly improved.

An object of the present disclosure is to provide a powder atomic layer deposition equipment with a quick release function, allowing a vacuum chamber with powders to be released from a shaft sealing device after an atomic layer deposition process has been done, and another vacuum chamber with powders loaded to be fixed to the shaft sealing device to perform a powder atomic layer deposition, thereby improving the efficiency of the manufacturing process.

To achieve the abovementioned objects, the present disclosure provides a powder atomic layer deposition equipment with a quick release function, comprising a driving unit; a shaft sealing device connected to the driving unit; a vacuum chamber connected to the shaft sealing device, and an enclosed space is formed between the shaft sealing device and the vacuum chamber, wherein the vacuum chamber includes a reaction space for accommodating a plurality of powders, and the driving unit rotates the vacuum chamber via the shaft sealing device; at least one first seal ring and at least one second seal ring, located between the shaft sealing device and the vacuum chamber, wherein the enclosed space is located between the first seal ring and the second seal ring; at least one first air extraction line, located in the shaft sealing device and fluidly connected to the enclosed space, wherein the first air extraction line is used in pumping gas out from the enclosed space to fix the vacuum chamber to the shaft sealing device; and at least one air intake line, located in the shaft sealing device and fluidly connected to the reaction space of the vacuum chamber, for delivering a precursor gas into the reaction space.

The powder atomic layer deposition equipment with a quick release function, comprising a second air extraction line located in the shaft sealing device and fluidly connected to the reaction space of the vacuum chamber.

The powder atomic layer deposition equipment with a quick release function, wherein the shaft sealing device comprises an outer tube and an inner tube, the outer tube including an accommodating space for accommodating the inner tube, and the inner tube including at least one connecting space for accommodating the first air extraction line and the air intake line.

The powder atomic layer deposition equipment with a quick release function, wherein the first seal ring is located between the inner tube and the vacuum chamber, and the second seal ring is located between the outer tube and the vacuum. The first seal ring is a dynamic seal ring, and the second seal ring is a static seal ring.

The powder atomic layer deposition equipment with a quick release function, wherein the driving unit is connected to the vacuum chamber via the outer tube, and rotates the vacuum chamber.

The powder atomic layer deposition equipment with a quick release function, wherein the vacuum chamber comprises a recessed part located at a bottom of the vacuum chamber. The recessed part is used for accommodating part of the inner tube protruding from the shaft sealing device, with an enclosed space formed between the inner tube and the recessed part of the vacuum chamber.

The powder atomic layer deposition equipment with a quick release function, wherein the recessed part extends from the bottom of the vacuum chamber to the reaction space and forms a protruding tubular part.

The powder atomic layer deposition equipment with a quick release function, further comprising a filter unit located in the recessed part of the vacuum chamber. In addition, the air intake line is fluidly connected to the reaction space of the vacuum chamber via the filter unit.

The powder atomic layer deposition equipment with a quick release function, wherein the air intake line is used in delivering a non-reactive gas into the reaction space to blow the powders in the reaction space.

The powder atomic layer deposition equipment with a quick release function, wherein the air intake line includes at least one non-reactive gas delivering pipeline, located in the shaft sealing device and fluidly connected to the reaction space of the vacuum chamber. The non-reactive gas delivering pipeline is used in delivering a non-reactive gas into the reaction space to blow the powders in the reaction space.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Please refer to FIG. 1, FIG. 2, FIG. 3 and FIG. 4, illustrating a powder atomic layer deposition equipment with a quick release function according to one embodiment of the present invention. As shown in the figures, a powder atomic layer deposition equipment with a quick release function 10 mainly comprises a vacuum chamber 11, a shaft sealing device 13, and a driving unit 15, wherein the driving unit 15 is connected to the vacuum chamber 11 via the shaft sealing device 13 and rotates vacuum chamber 11.

The vacuum chamber 11 has a reaction space 12 inside, for accommodating a plurality of powders 121, wherein the powders 121 may be quantum dots, for example, II-VI semiconductor materials of ZnS, CdS, CdSe, etc. The thin film formed on the quantum dots may be of $Al_2O_3$. The vacuum chamber may include a cover plate 111 and a chamber 113, wherein an inner surface 1111 of the cover plate 111 is used to cover the chamber 113 and forms a reaction space 12 between the inner surface 1111 and the chamber 113.

In one embodiment of the present invention, a monitoring wafer 115 may be configured on the inner surface 1111 of the cover 111 plate, wherein when the cover plate 111 covers the chamber 113, the monitoring wafer 115 is located in the reaction space 12. When an atomic layer deposition is performed in the reaction space 12, a thin film is formed on a surface of the monitoring wafer. In practical applications, the film thickness on the surface of the monitoring wafer 115 and the film thickness on the surface of the powders 121 may be further measured, and the relationship between the two may be calculated. Then, the film thickness on the surface of the monitoring wafer 115 may be measured to calculate the film thickness on the surface of the powders 121.

Figure 1:
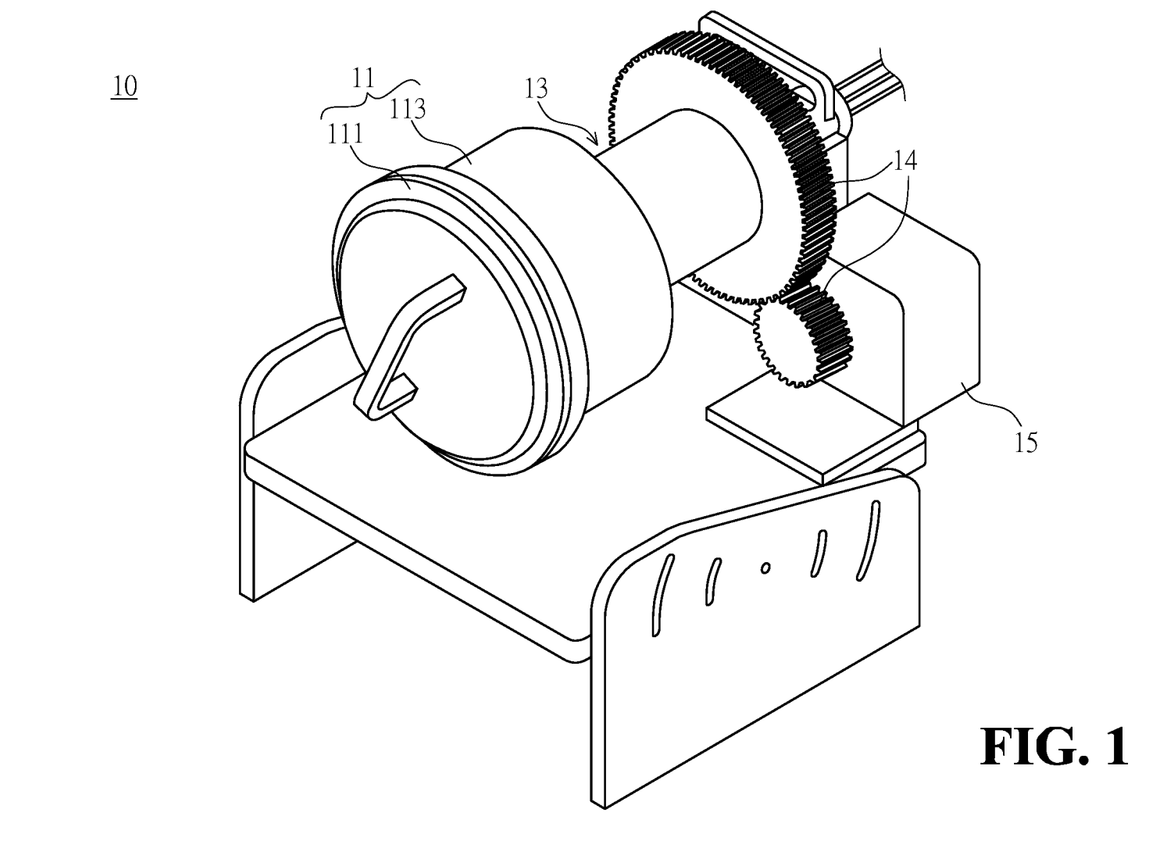
FIG. 1 is a perspective view illustrating a powder atomic layer deposition equipment with a quick release function according to one embodiment of the present invention.
Figure 2:
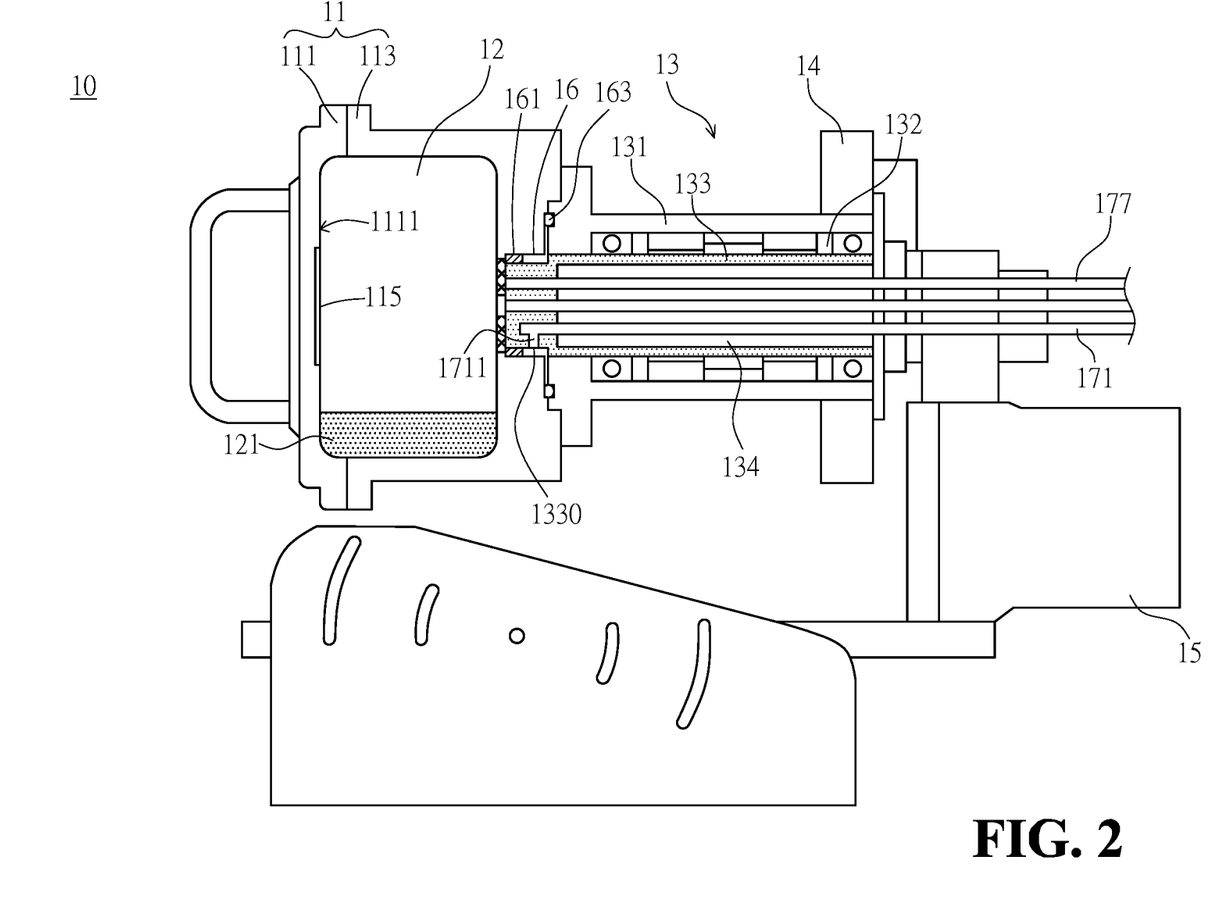
FIG. 2 is a sectional view of a powder atomic layer deposition equipment with a quick release function according to one embodiment of the present invention.
Figure 3:
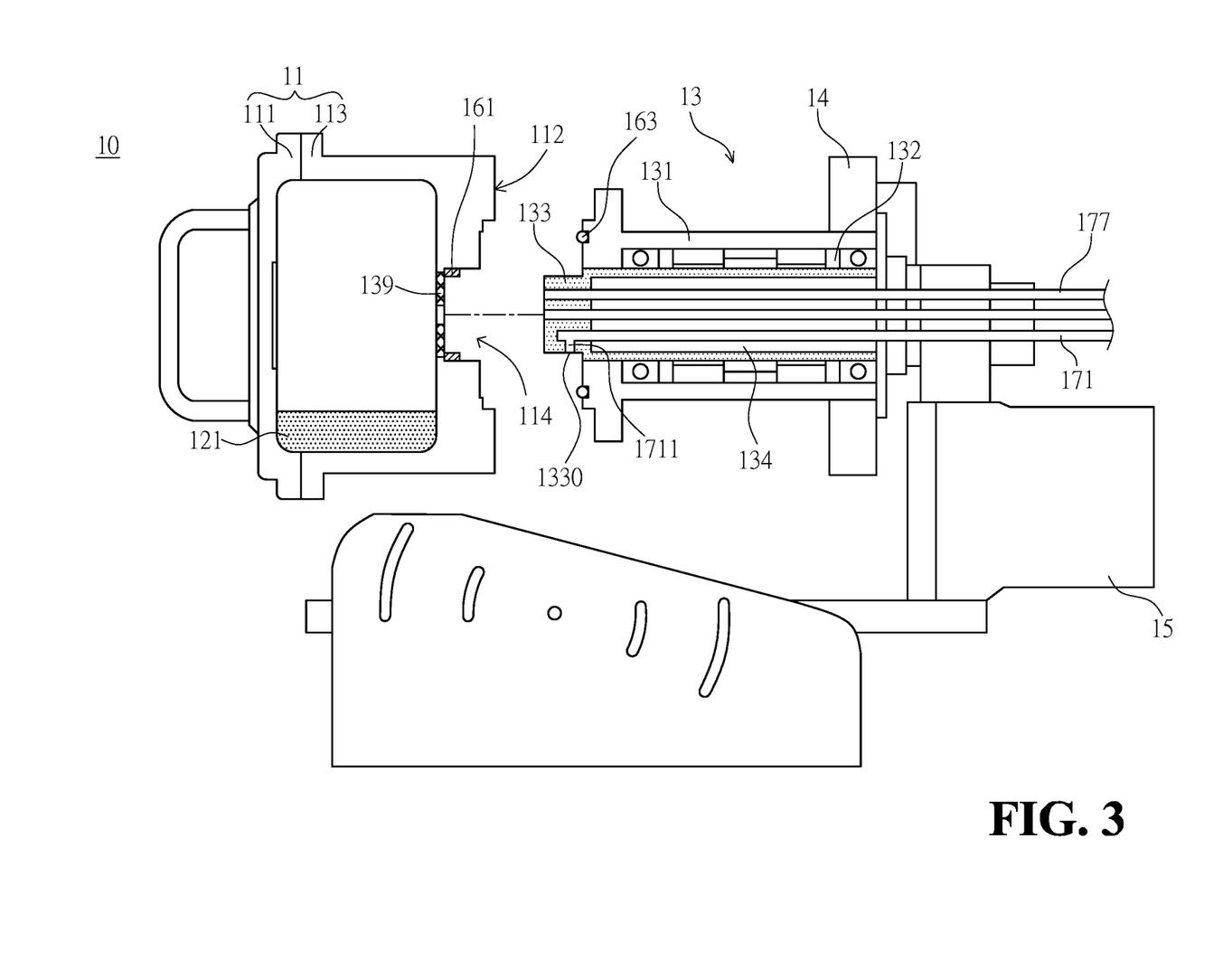
FIG. 3 is another sectional view of a powder atomic layer deposition equipment with a quick release function according to one embodiment of the present invention.
Figure 4:
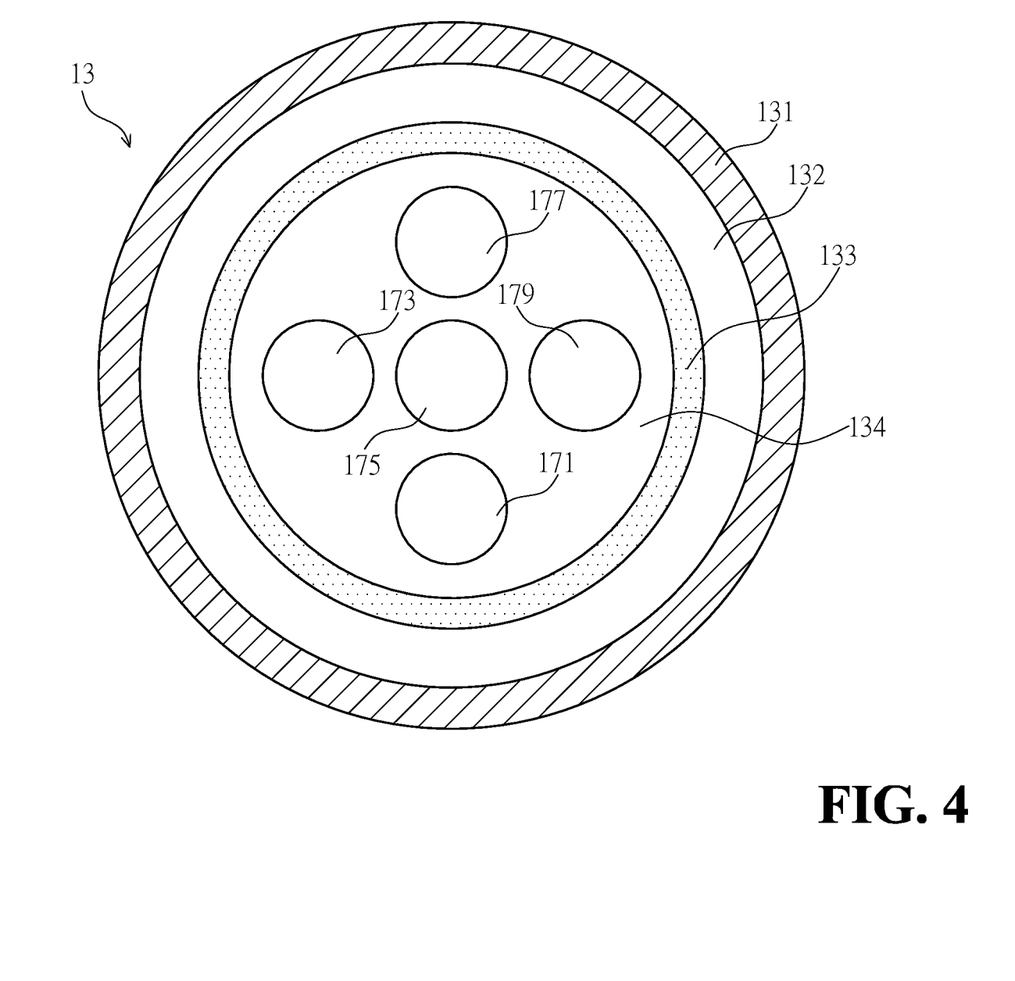
FIG. 4 is a sectional view of a powder atomic layer deposition equipment with a quick release function according to one embodiment of the present invention.

The shaft sealing device comprises an outer tube 131 and an inner tube 133, wherein the outer tube 131 has an accommodating space 132, and the inner tube 133 has a connecting space 134. For example, the outer tube 131 and the inner tube 133 may be hollow cylinders. The accommodating space 132 of the outer tube 131 may accommodate the inner tube 133, wherein the outer tube 131 and the inner tube 133 are coaxially disposed. The shaft sealing device may be a common shaft seal or magnetic fluid shaft seal, and is mainly used in isolating the reaction space 12 of the vacuum chamber 11 from an exterior space to maintain the vacuum of the reaction space 12.

The driving unit 15 is connected to one end of the shaft sealing device, and rotates the vacuum chamber 11 via the shaft sealing device 13. For example, the driving unit 15 is connected to the vacuum chamber 13 via the outer tube 131, and rotates the vacuum chamber 11 via the outer tube 131.

The driving unit 15 may be connected to and rotate the outer tube 131 and the vacuum chamber 11 in a same direction, for example, a continuous clockwise or counter-clockwise rotation. In certain other embodiments, the driving unit 15 may rotate the outer tube 131 and the vacuum chamber 11 clockwise for a specific angle, followed by a counterclockwise rotation of the specific angle. For example, the specific angle may be 360°. When the vacuum chamber 11 rotates, it stirs the powders 121 in the reaction space 12 to facilitate a uniform heating of the powders 121 and their contact with a precursor gas or a non-reactive gas.

In one embodiment of the present invention, the driving unit 15 may be a motor, connected to the outer tube 131 via at least one gear 14, and rotate the outer tube 131 and the vacuum chamber 11 via the gear 14 with respect to the inner tube 133.

The connecting space 134 of the inner tube 133 may be configured with at least one first air extraction line 171, at least one air intake line 173, at least one non-reactive gas delivering pipeline 175, a heater 177, and/or a second air extraction line 179, as shown in FIG. 2 and FIG. 4.

The vacuum chamber 11 and the shaft sealing device of the present invention are two independent components, wherein the vacuum chamber 11 may be released/dismounted from the shaft sealing device 13, or be fixed to the shaft sealing device. When the vacuum chamber 11 is connected to the shaft sealing device 13, an enclosed space 16 is formed between the two. For example, the enclosed space 16 may be ring-shaped and surround the shaft sealing device 13. The first air extraction line 171 is fluidly connected to the enclosed space 16 and is used in pumping gas out from the enclosed space 16, or in delivering gas into the enclosed space 16.

The second air extraction line 179 is fluidly connected to the reaction space 12 of the vacuum chamber 11, and is used in pumping gas out from the reaction space 12, such that the reaction space 12 is in a vacuum state for an atomic layer deposition process. Specifically, the second air extraction line 179 is connected to a pump, and gas in the reaction space 12 is pumped out by the pump.

The air intake line 173 is fluidly connected to the reaction space 12 of the vacuum chamber 11, and is used in delivering a precursor gas or a non-reactive gas into the reaction space 12, wherein the non-reactive gas may be an inert gas such as nitrogen or argon. For example, the air intake line 173 may be connected to a precursor gas storage tank and a non-reactive gas storage tank via a valve element, and deliver the precursor gas into the reaction space 12 to deposit the precursor gas on the surface of the powders 121. In practical application, the air intake line may deliver the precursor gas along with a carrier gas into the reaction space 12. Subsequently, the non-reactive gas is delivered into the reaction space 12 by the valve element, and gas is pumped out via the second air extraction line 179 to remove the precursor gas in the reaction space 12. In one embodiment of the present invention, the air intake line 173 may be connected to a plurality of branches, and sequentially deliver different precursor gases into the reaction space 12 via the plurality of branches, respectively.

Further, the flow rate of the non-reactive gas delivered by the air intake line 173 may be increased, and blow the powders 121 in the reaction space by the non-reactive gas, such that the powders 121 is moved by the non-reactive gas and spread to various areas of the reaction space 12.

In one embodiment of the present invention, the air intake line 173 may include at least one non-reactive gas delivering pipeline 175, connected to the reaction space 12 of the vacuum chamber 11, and is used in delivering a non-reactive gas into the reaction space 12. For example, the non-reactive gas delivering pipeline 175 may be connected to a nitrogen storage tank via a valve element, and deliver nitrogen into the reaction space 12 via the valve element. The non-reactive gas which is used to blow and move the powders 121 in the reaction space 12, cooperating with the driving unit 15 which rotates the vacuum chamber 11, can effectively and uniformly stir the powders 121 in the reaction space 12 and uniform thin film can be deposited on the surface of each powders 121.

Both the air intake line 173 and the non-reactive gas delivering line 175 of the powder atomic layer deposition equipment with a quick release function 10 are used in delivering a non-reactive gas into the reaction space 12, wherein a flow rate of the non-reactive gas delivered by the air intake line 173 is lower, mainly useful in removing a precursor gas in the reaction space 12, and a flow rate of the non-reactive gas delivered by the non-reactive gas delivering line 175 is higher, mainly useful in blowing and moving the powders 121 in the reaction space 12.

Specifically, the air intake line 173 and the non-reactive gas delivering line 175 deliver the non-reactive gas into the reaction space 12 at different time points. Therefore, in practical applications, the non-reactive gas delivering line 175 may be omitted, and the flow rate of the non-reactive gas delivered by the air intake line 173 at different time points may be adjusted. In removing a precursor gas in the reaction space 12, the flow rate of the non-reactive gas delivered by the air intake line 173 into the reaction space 12 may be decreased, while in blowing and moving the powders 121 in the reaction space 12, the flow rate of the non-reactive gas delivered by the air intake line 173 into the reaction space 12 may be increased.

When the driving unit 15 of the present invention rotates the outer tube 131 and the vacuum chamber 11, the inner tube 133 and the first air extraction line 171, second air extraction line 179, the air intake line 173, and/or the non-reactive gas delivering pipeline 175 therein are not rotated. This is beneficial to increasing the stability of delivery of non-reactive gas and/or precursor gas by the air intake line 173 and/or the non-reactive gas delivering pipeline 175 into the reaction space 12.

A heater 177 is used to heat the connecting space 134 and the inner tube 133, and the second air extraction line 179, the air intake line 173 and/or the non-reactive gas delivering pipeline 175 in the inner tube 133 are heated by the heater 177, to increase the temperature of gas in the second air extraction line 179, the air intake line 173 and/or the non-reactive gas delivering pipeline 175. As such, when non-reactive gases and/or precursor gases enter the reaction space 12, the temperature of the reaction space 12 does not drop or change significantly. In addition, a temperature sensing unit may be configured in the connecting space 134 to measure the temperature of the heater 177 or the connecting space 134 so as to retrieve information on a work status of the heater 177. Of course, another heating device is usually configured inside, outside or around the vacuum chamber 11, wherein the heating device is adjacent or in contact with the vacuum chamber 11 and is used in heating the vacuum chamber and the reaction space 12.

When performing an atomic layer deposition process, the reaction space 12 of the vacuum chamber 11 is required to maintain in a vacuum state, and thus the vacuum chamber 11 usually has a thicker structure and a heavier weight. The shaft sealing 13 is used to support and rotate the vacuum chamber 11 and also has a thicker structure and a heavier weight. In operation a use needs to release/dismount the vacuum chamber 11 from the driving unit 15 along with the shaft sealing device 13 in order to take out the powders 121 in the vacuum chamber 11 and clean the vacuum chamber 11. This not only causes a burden on the user, but also may cause a collision during operation and cleaning, which may result in injury to the user or damage to the equipment.

To address the above problem, the vacuum chamber 11 and the shaft sealing device 13 of the present invention are designed as two independent components. In performing an atomic layer deposition, the vacuum chamber 11 may be connected to the shaft sealing device 13 as shown in FIG. 2, forming an enclosed space 16 between the vacuum chamber 11 and the shaft sealing device 13. Then the gas in the enclosed space 16 is pumped out via the first air extraction line 171 such that the enclosed space 16 is in a vacuum state, to fix the vacuum chamber 11 to the shaft sealing device 13. Further, the driving unit 15 can rotate the vacuum chamber 11 via the shaft sealing device 13. When the vacuum chamber 11 is connected to the shaft sealing device 13, the second air extraction line 179, the air intake line 173 and/or the non-reactive gas delivering pipeline is fluidly connect to the reaction space 12 of the vacuum chamber 11.

After the atomic layer deposition has been done, the vacuum of the enclosed space 16 may be released via the first air extraction line 171. For example, delivering gas via the first air extraction line 171 into the enclosed space 16 to release/dismount the vacuum chamber 11 from the shaft sealing device 13.

In the powder atomic layer deposition equipment with a quick release function 10 of the present invention, the vacuum chamber 11 can be quickly released/dismounted from the shaft sealing device 13, and another vacuum chamber 11 can be installed to the shaft sealing device 13. In the process of releasing and installing vacuum chambers 11, it is only required to pump gas out from the enclosed space 16 via the first air extraction line 171 by a pump, or to deliver gas into the enclosed space 16 via the first pumping line 171, while fixing the vacuum chamber 11 and the shaft sealing device 13 by screws is not required, thereby greatly improving the speed and convenience of replacing the vacuum chamber 11.

In one embodiment of the present invention, a plurality of seal rings may be disposed between the shaft sealing device 13 and the vacuum chamber 11, wherein the enclosed space 16 is located between two seal rings, and the enclosed space 16 is isolated from an exterior space by the seal rings. Specifically, the seal rings include a first seal ring 161 and a second seal ring 163. When the vacuum chamber 13 is connected to the shaft sealing device 13, the vacuum chamber 11 and the shaft sealing device 13 press the first seal ring 161 and the second seal ring 163 therebetween, and the enclosed space 16 is formed between the first seal ring 161 and the second seal ring 163. As shown in FIG. 3, the first seal ring 161 is configured on the vacuum chamber 11, and the second seal ring is configured on the shaft sealing device 13.

In practical applications, the first seal ring 161 is disposed between the inner tube 133 and the vacuum chamber 11, and the second seal ring 163 is disposed between the outer tube 131 and the vacuum chamber 11, wherein the first seal ring 161 is a dynamic seal ring, and the second seal ring 163 is a static seal ring. For example, the first seal ring 161 may be sleeved on the inner tube 133 and is a PTFE O-ring, and the second seal ring 163 is an O-ring made of a rubber.

In one embodiment of the present invention, as shown in FIG. 3, a recessed part 114 may be configured on a bottom 112 of the vacuum chamber 11, and the first seal ring 161 is disposed in the recessed part 114. The inner tube 133 of the shaft sealing device partially protrudes from the outer tube 131, and the second seal ring 163 is disposed at a side of the shaft sealing device 13 to which the bottom 112 of the vacuum chamber 11 is connected, or sleeved on a protruding part of the inner tube 133.

The cross-sectional area in a radial direction of the inner tube 133 protruded from the shaft sealing device 13 is slight greater than that of the recessed part 114 of the vacuum chamber 11. When the protruded inner tube 133 is inserted into the recessed part 114 of the vacuum chamber 11, the protruded inner tube 133 presses the first seal ring 161 in the recessed part 114, and the bottom 112 of the vacuum chamber 11 or the recessed part 114 presses the second seal ring 163 disposed on the shaft sealing device 13, so as to form the enclosed space 16 between the protruded inner tube 133, the recessed part 114, the first seal ring 161, and/or the second seal ring 163. The above mentioned numbers and locations of configuration of the protruded inner tube 133, the recessed part 114, the first seal ring 161, and/or the second seal ring 163 are only of one embodiment of the present invention, and the present invention is not limited thereto.

An opening 1330 is configured on a side wall the inner tube 133 of the shaft sealing device 13 of the present invention. The first air extraction line 171 is configured generally along an axial direction of the shaft sealing device 13 and has a branch 1711 branching or bending along a radial direction of the shaft sealing device 13, and the branch 1711 is connected to the opening 1330 on the side wall of the inner tube 133, such that the first air extraction line 171 is fluidly connected to the enclosed space 16 via the opening 1330 on the side wall of the inner tube 133.

The powder atomic layer deposition equipment with a quick release function 10 as described in the present disclosure is also advantageous in improving the process efficiency of atomic layer deposition. Specifically, multiple vacuum chambers may be prepared and powders 121 may be placed in each vacuum chamber 11. One of the vacuum chambers 11 is fixed to the shaft sealing device 13, and perform an atomic layer deposition on the powders 121 in the vacuum chamber 11. After the atomic layer deposition has been done, the vacuum chamber 11 with powders 121 therein is released/dismounted from the shaft sealing device 13, and another vacuum chamber 11 is fixed to the shaft sealing device 13 to perform an atomic layer deposition process on the powders 121 in the vacuum chamber 11. The released vacuum chamber 11 may be placed in a cooling area, and the powders 121 are taken out from the vacuum chamber 11 after the temperature of the vacuum chamber 11 and powders 121 therein is decreased.

In one embodiment of the present invention, the bottom 112 of the vacuum chamber 11 may be configured with a filter unit 139. For example, the filter unit 139 may be disposed in the recessed part 114 of the vacuum chamber 11. When the vacuum chamber 11 is connected to the shaft sealing device 13, the filter unit 139 on the vacuum chamber 11 covers the inner tube 133 of the shaft sealing device 13, such that the second air extraction line 179, air intake line 173, and/or non-reactive gas delivering pipeline 175 is connected to the reaction space 12 of the vacuum chamber 11 via the filter unit 139.

Through the configuration of the filter unit 139, loss of powders 121 when gas is pumped out from the reaction space 12 via the second air extraction line 179 can be avoided. On the other hand, disposing on the filter unit 139 on the vacuum chamber 11 instead of on the shaft sealing device avoids that the powders 121 scatter out from the reaction space of the vacuum chamber 11 when the vacuum chamber 11 is released/dismounted from the shaft sealing device 13.

Figure 5:
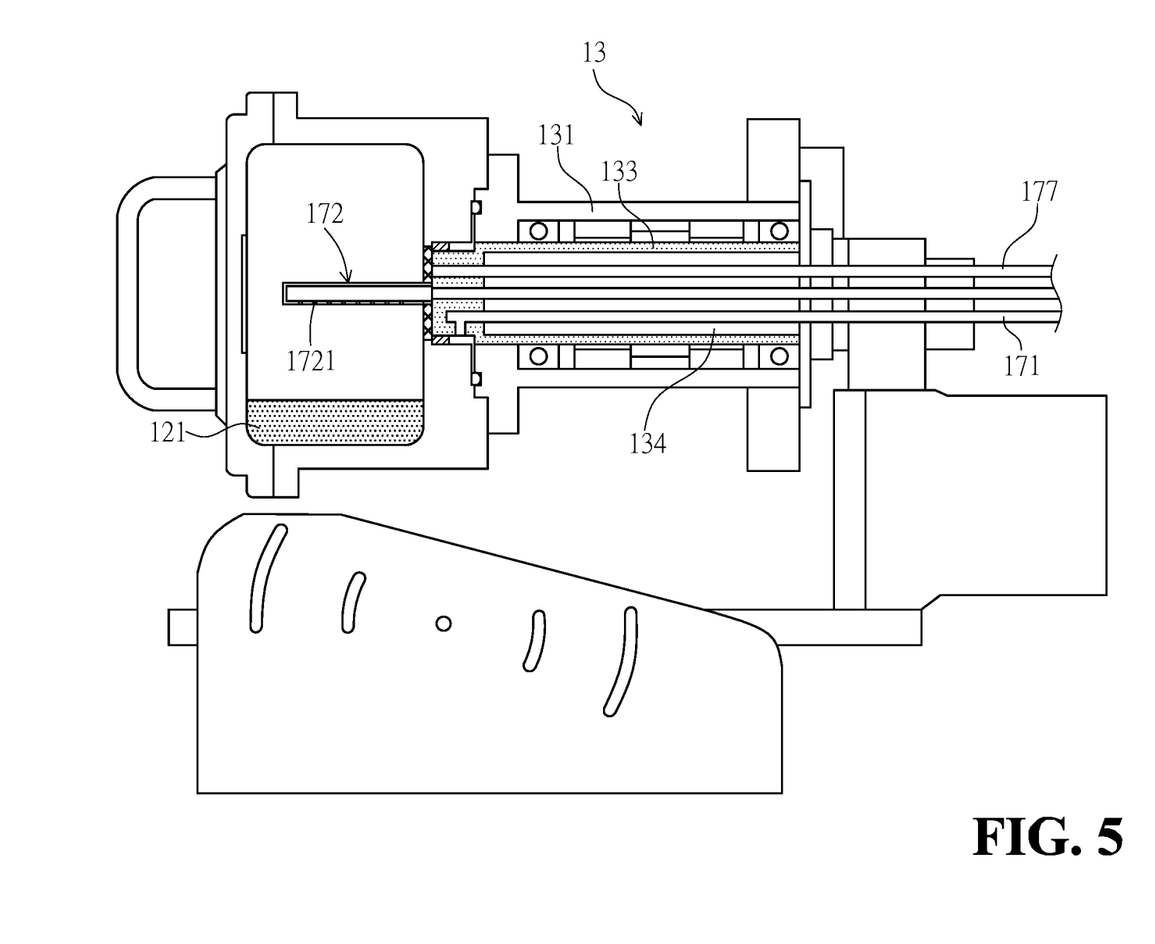
FIG. 5 is a sectional view of a powder atomic layer deposition equipment with a quick release function according to another embodiment of the present invention.

In one embodiment of the present invention, as shown in FIG. 5, the air intake line 173 and/or non-reactive gas delivering pipeline may extends from the connecting space 134 of the inner tube 133 to the reaction space 12 of the vacuum chamber 11, and forms an extension tube 172 in the reaction space 12 of the vacuum chamber 11. The extension tube 172 may be configured with at least one vent hole 1721 on a terminal part and/or a wall thereof. Non-reactive gas may be delivered to the reaction space 12 via the vent hole 1721 of the extension tube 172 to blow and move the powders 121 in the reaction space 12.

Figure 6:
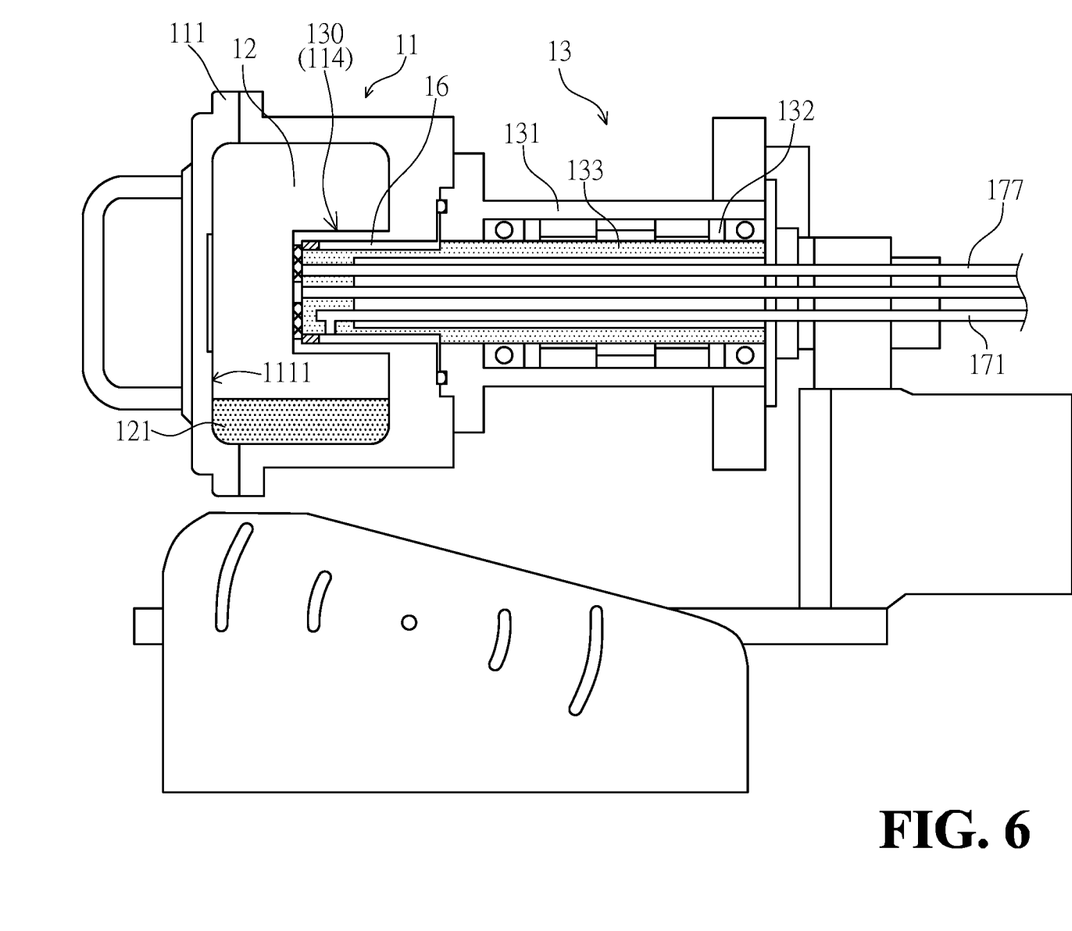
FIG. 6 is a sectional view of a powder atomic layer deposition equipment with a quick release function according to another embodiment of the present invention.
Figure 7:
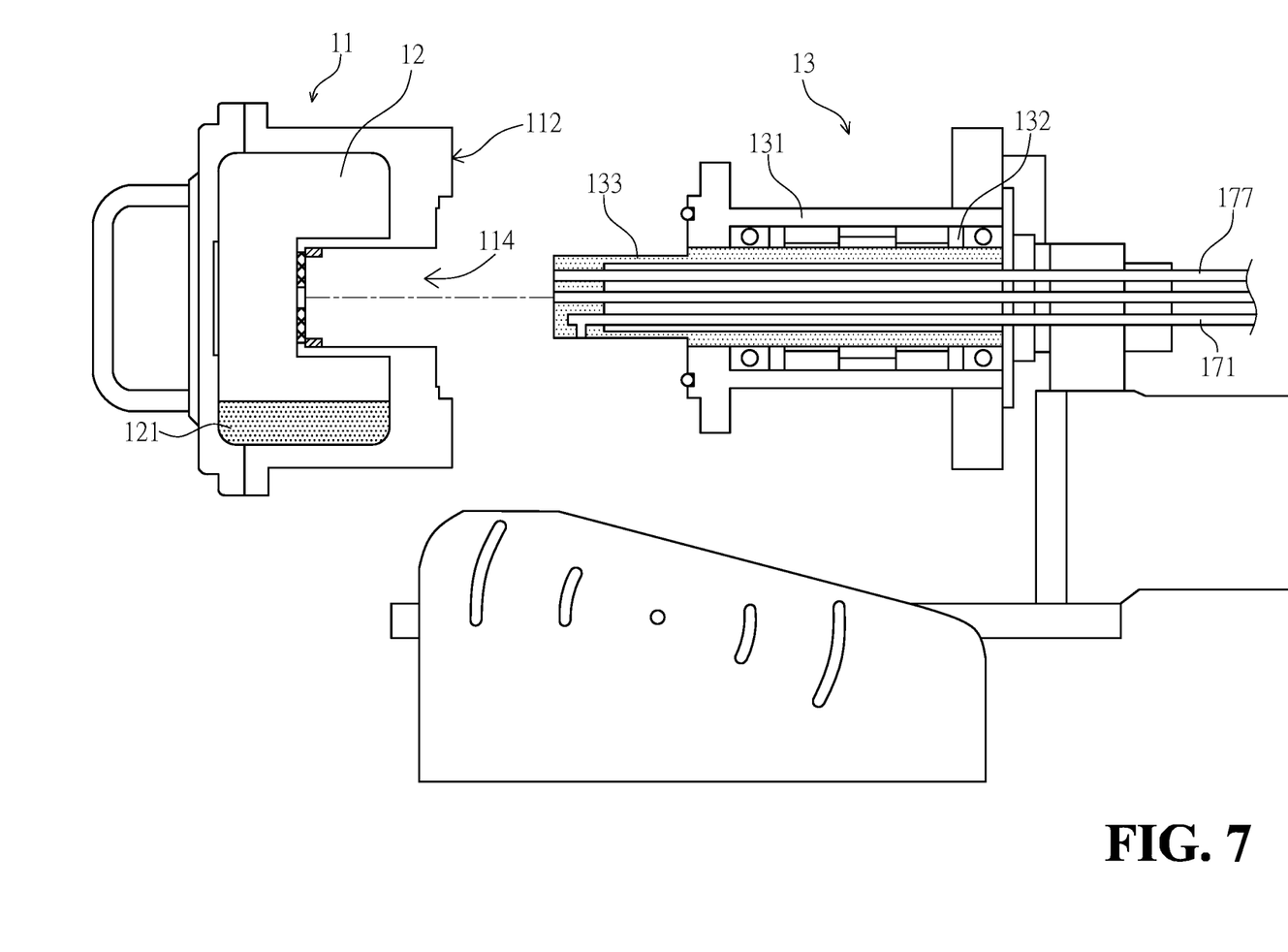
FIG. 7 is another sectional view of a powder atomic layer deposition equipment with a quick release function according to another embodiment of the present invention.

In one embodiment of the present invention, the recessed part 114 may extend from the bottom 112 of the vacuum chamber 11 to the reaction space 12, the inner tube 133 of the shaft sealing device 13 may extend from the accommodating space 132 of the outer tube 131 to an exterior and protrude from the outer tube 131 of the shaft sealing device 13, as shown in FIG. 7. To connect the vacuum chamber and the shaft sealing device, the protrude inner tube 133 of the shaft sealing device may be inserted into the recessed part 114, and the enclosed space 16 is formed between the inner tube 133 and the recessed part 114 of the vacuum chamber 11, as shown in FIG. 6. Further, the inner tube 133 of the shaft sealing device extends from the accommodating space 132 of the outer tube to the recessed part 114 and/or reaction space 12 of the vacuum chamber 11, such that the inner tube 133 and the recessed part form a protruding tubular part 130 in reaction space 12.

Through the configuration of the protruding tubular part 13, the distance between the air intake line 173 and/or the non-reactive gas delivering pipeline 175 and the cover plate 111 can be shortened or adjusted. Non-reactive gas delivered to the reaction space 12 via the air intake line 173 and/or the non-reactive gas delivering pipeline 175 can be transmitted to the inner surface 1111 of the cover plate 111, and spread to various areas of the reaction space 12, to facilitate blowing and moving the powders 121 in the reaction space 12.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

We claim:

1. A powder atomic layer deposition equipment with a quick release function, comprising:
 a driving unit;
 a shaft sealing device connected to the driving unit; wherein the shaft sealing device comprises an outer tube and an inner tube, the outer tube including an accommodating space for accommodating the inner tube, and the inner tube including at least one connecting space;
 a vacuum chamber connected to the shaft sealing device, and an enclosed space is formed between the vacuum chamber and the shaft sealing device, wherein the vacuum chamber includes a reaction space for accommodating a plurality of powders, and the driving unit rotates the vacuum chamber via the shaft sealing device;
 at least one first seal ring and at least one second seal ring, located between the shaft sealing device and the vacuum chamber, wherein the enclosed space is located between the at least one first seal ring and the at least one second seal ring;
 at least one first air extraction line, located in the shaft sealing device and fluidly connected to the enclosed space, wherein the at least one first air extraction line is used in pumping gas out from the enclosed space to fix the vacuum chamber to the shaft sealing device; and
 at least one air intake line, located in the shaft sealing device and fluidly connected to the reaction space of the vacuum chamber, for delivering a precursor gas into the reaction space; wherein the at least one connecting space of the inner tube provided for accommodating the at least one first air extraction line and the at least one air intake line.

2. The powder atomic layer deposition equipment with a quick release function according to claim 1, comprising a second air extraction line located in the shaft sealing device and fluidly connected to the reaction space of the vacuum chamber.

3. The powder atomic layer deposition equipment with a quick release function according to claim 1, wherein the at least one first seal ring is located between the inner tube and the vacuum chamber, and the at least one second seal ring is located between the outer tube and the vacuum, the at least one first seal ring being a dynamic seal ring and the at least one second seal ring being a static seal ring.

4. The powder atomic layer deposition equipment with a quick release function according to claim 1, wherein the at least one first air extraction line is configured along an axial direction of the inner tube and comprises a branch part, the at least one first air extraction line being connected to the enclosed space via the branch part.

5. The powder atomic layer deposition equipment with a quick release function according to claim 4, wherein the inner tube is configured with an opening on a side wall thereof, and the at least one first air extraction line is connected to the enclosed space via the branch part and the opening.

6. The powder atomic layer deposition equipment with a quick release function according to claim 1, comprising a heater located in the at least one connecting space of the inner tube, and is used in heating the at least one connecting space and the inner tube.

7. The powder atomic layer deposition equipment with a quick release function according to claim 1, wherein the driving unit is connected to the vacuum chamber via the outer tube and rotates the vacuum chamber.

8. The powder atomic layer deposition equipment with a quick release function according to claim 1, wherein the shaft sealing device is a shaft seal or a magnetic fluid shaft seal.

9. The powder atomic layer deposition equipment with a quick release function according to claim 1, wherein the at least one air intake line is used in delivering a non-reactive gas into the reaction space, and the powders in the reaction space are moved by the non-reactive gas.

10. The powder atomic layer deposition equipment with a quick release function according to claim 1, wherein the vacuum chamber includes a cover plate and a chamber, and an inner surface of the cover plate is used to cover the chamber and forms the reaction space between the inner surface of the cover plate and the chamber, the inner surface of the cover plate being configured with a monitoring wafer, located in the reaction space.

11. A powder atomic layer deposition equipment with a quick release function, comprising:
- a driving unit;
- a shaft sealing device comprising an outer tube and an inner tube, the outer tube including an accommodating space for accommodating the inner tube, and the inner tube including at least one connecting space, wherein part of the inner tube protrudes from the outer tube;
- a vacuum chamber comprising a recessed part located at a bottom of the vacuum chamber, the recessed part being used for accommodating said part of the inner tube protruding from the outer tube, with an enclosed space formed between the inner tube of the shaft sealing device and the recessed part of the vacuum chamber, wherein the vacuum chamber includes a reaction space for accommodating a plurality of powders, and the driving unit is connected to and rotates the vacuum chamber via the outer tube of the shaft sealing device;
- at least one first seal ring and at least one second seal ring, located between the shaft sealing device and the vacuum chamber, wherein the enclosed space is located between the at least one first seal ring and the at least one second seal ring;
- at least one first air extraction line, located in the shaft sealing device and fluidly connected to the enclosed space, wherein the at least one first air extraction line is used in pumping gas out from the enclosed space to fix the vacuum chamber to the shaft sealing device; and
- at least one air intake line, located in the shaft sealing device and fluidly connected to the reaction space of the vacuum chamber, for delivering a precursor gas into the reaction space.

12. The powder atomic layer deposition equipment with a quick release function according to claim 11, wherein the at least one first seal ring is disposed in the recessed part of the vacuum chamber.

13. The powder atomic layer deposition equipment with a quick release function according to claim 12, wherein the at least one second seal ring is configured at a side of the shaft sealing device to which the bottom of the vacuum chamber is connected, or sleeved on said part of the inner tube protruding from the outer tube.

* * * * *